United States Patent
Jäger et al.

(10) Patent No.: US 10,483,444 B2
(45) Date of Patent: Nov. 19, 2019

(54) METHOD OF PRODUCING AN OPTOELECTRONIC SEMICONDUCTOR COMPONENT, OPTOELECTRONIC SEMICONDUCTOR COMPONENT, AND TEMPORARY CARRIER

(71) Applicant: OSRAM Opto Semiconductors GmbH, Regensburg (DE)

(72) Inventors: Harald Jäger, Regensburg (DE); Jürgen Moosburger, Lappersdorf (DE); Herbert Brunner, Sinzing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/757,141

(22) PCT Filed: Aug. 30, 2016

(86) PCT No.: PCT/EP2016/070359
§ 371 (c)(1),
(2) Date: Mar. 2, 2018

(87) PCT Pub. No.: WO2017/037037
PCT Pub. Date: Mar. 9, 2017

(65) Prior Publication Data
US 2018/0261742 A1    Sep. 13, 2018

(30) Foreign Application Priority Data
Sep. 2, 2015  (DE) .......................... 10 2015 114 662

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/48* (2013.01); *H01L 24/97* (2013.01); *H01L 33/486* (2013.01); *H01L 33/502* (2013.01); *H01L 33/54* (2013.01); *H01L 33/52* (2013.01); *H01L 2224/48091* (2013.01); *H01L 2224/48245* (2013.01); *H01L 2224/48247* (2013.01);
(Continued)

(58) Field of Classification Search
CPC ..... H01L 33/486; H01L 33/54; H01L 33/502; H01L 2924/12041
See application file for complete search history.

(56) References Cited

U.S. PATENT DOCUMENTS

| | | | |
|---|---|---|---|
| 6,940,167 | B2 | 9/2005 | Amador et al. |
| 2008/0115350 | A1 | 5/2008 | Kerr et al. |

(Continued)

FOREIGN PATENT DOCUMENTS

| | | |
|---|---|---|
| DE | 10 2005 041 064 A1 | 3/2007 |
| DE | 10 2009 036 621 A1 | 2/2011 |

(Continued)

*Primary Examiner* — Samuel A Gebremariam
(74) *Attorney, Agent, or Firm* — DLA Piper LLP (US)

(57) ABSTRACT

A method of producing an optoelectronic semiconductor component includes providing a carrier including two metal layers, wherein the metal layers are detachable from one another, securing an optoelectronic semiconductor chip on the first metal layer of the carrier, and mechanically detaching the second metal layer from the first metal layer.

11 Claims, 11 Drawing Sheets

(51) Int. Cl.
*H01L 33/54* (2010.01)
*H01L 33/50* (2010.01)
*H01L 23/00* (2006.01)
*H01L 33/48* (2010.01)
*H01L 33/52* (2010.01)

(52) U.S. Cl.
CPC ............ *H01L 2224/48464* (2013.01); *H01L 2224/95001* (2013.01); *H01L 2224/97* (2013.01); *H01L 2924/12041* (2013.01); *H01L 2924/15747* (2013.01); *H01L 2924/181* (2013.01); *H01L 2924/18301* (2013.01); *H01L 2933/005* (2013.01); *H01L 2933/0041* (2013.01); *H01L 2933/0066* (2013.01)

(56) References Cited

U.S. PATENT DOCUMENTS

2012/0279772 A1* 11/2012 Sun .................... H01L 21/4821
174/260
2015/0236233 A1 8/2015 Yamashita et al.

FOREIGN PATENT DOCUMENTS

| DE | 10 2013 100 711 A1 | 7/2014 |
|----|---|---|
| DE | 10 2013 206 225 A1 | 10/2014 |
| DE | 11 2013 003 887 T5 | 5/2015 |

* cited by examiner

METHOD OF PRODUCING AN OPTOELECTRONIC SEMICONDUCTOR COMPONENT, OPTOELECTRONIC SEMICONDUCTOR COMPONENT, AND TEMPORARY CARRIER

TECHNICAL FIELD

This disclosure relates to a method of producing an optoelectronic semiconductor component, an optoelectronic semiconductor component, and a temporary carrier for producing an optoelectronic semiconductor component.

BACKGROUND

Temporary carriers are used during production of optoelectronic semiconductor components, a semiconductor chip being mounted onto the temporary carriers. After contacting and potting the semiconductor chip with a potting compound, the temporary carrier is detached again. This may be carried out, for example, by laser detachment in a transparent carrier or by etching a copper carrier, for example.

There is nonetheless a need for an improved method of producing an optoelectronic semiconductor component, an improved optoelectronic semiconductor component and an improved temporary carrier used to produce an optoelectronic semiconductor component.

SUMMARY

We provide a method of producing an optoelectronic semiconductor component including providing a carrier including two metal layers, wherein the metal layers are detachable from one another, securing an optoelectronic semiconductor chip on the first metal layer of the carrier, and mechanically detaching the second metal layer from the first metal layer.

We also provide an optoelectronic semiconductor component including a light-emitting semiconductor chip and contact pads, wherein the contact pads comprise a material of an intermediate layer optionally comprising chromium.

We further provide a temporary carrier used to produce an optoelectronic semiconductor component, the carrier including a first metal layer and a second metal layer, wherein the second metal layer is fitted on the first metal layer in a detachable fashion.

LIST OF REFERENCE SIGNS

100 Temporary carrier
110 First metal layer
111 First region
112 Second region
113 Third region
114 Fourth region
120 Second metal layer
130 Intermediate layer
140 Optoelectronic semiconductor chip
141 Underside of the optoelectronic semiconductor chip
142 Top side of the optoelectronic semiconductor chip
145 First optoelectronic semiconductor chip
146 Second optoelectronic semiconductor chip
150 Electrically conductive connection piece
151 First electrically conductive connection piece
152 Second electrically conductive connection piece
154 First electrical contacting pad
155 Second electrical contacting pad
160 Electrically insulating material
161 Conversion lamina
170 Region
171 First region
172 Second region
175 Separating line
180 Optoelectronic semiconductor component
181 First region
182 Second region
183 Third region
191 First body
192 Second body
193 Upper edge region

DETAILED DESCRIPTION

Our method of producing an optoelectronic semiconductor component comprises the following steps: Providing a temporary carrier comprising two metal layers, wherein the metal layers are mechanically detachable from one another. Securing an optoelectronic semiconductor chip on the first metal layer of the carrier. Detaching the second metal layer from the first metal layer. Detaching the second metal layer from the first metal layer is mechanical detaching in this case. This means, in particular, that the second metal layer is pulled up or torn away from the first metal layer, or mechanically detached from the first metal layer in some other way. Complex laser detachment methods or etching processes are obviated as a result.

Mechanically detaching the second metal layer from the first metal layer may be carried out by the second metal layer being fixedly held by a holder. Afterward, the holder is moved away from the first metal layer such that the second metal layer detaches from the first metal layer.

The optoelectronic semiconductor chip may electrically conductively connect to the first metal layer.

An electrically insulating material may additionally be applied on the first metal layer after the optoelectronic semiconductor chip has been fitted on the first metal layer and the electrical contacting of the optoelectronic semiconductor chip has been carried out. In this case, the electrically insulating material may be applied on the first metal layer by spreading, spraying or injection molding. However, further possibilities in applying the electrically insulating material are also possible. By virtue of the electrically insulating material, the optoelectronic semiconductor component acquires a stable structure.

The first metal layer may be patterned after the second metal layer has been detached such that mutually electrically insulated regions of the first metal layer arise. This may be carried out, for example, by sawing, laser erosion or etching. By patterning the first metal layer, mutually electrically insulated regions of the first metal layer may be produced in a simple and cost-effective manner. This is advantageous in particular if the mutually electrically insulated regions are then used to electrically contact the optoelectronic semiconductor component.

The metal layers, that is to say the first metal layer and the second metal layer, may comprise copper. In particular, the two metal layers consist of copper. First, copper is a good material for electrically contacting the optoelectronic semiconductor chip; second, copper is well suited to the described method of detaching the second metal layer from the first metal layer. The copper of the first and/or of the second metal layer may be coated with silver, a nickel-silver alloy, a nickel-palladium-gold alloy or with gold to improve contactability.

The carrier may comprise an additional layer, in particular an intermediate layer composed of chromium, between the two metal layers. Chromium is particularly suitable to support the process of detaching the second metal layer from the first metal layer.

The method may additionally comprise the following steps: applying a photoresist on the first metal layer, patterning the photoresist such that regions composed of the photoresist comprising a predefined cross section are present on the first metal layer, electrolytically applying a further metal on free regions, that is to say regions not covered by the photoresist, of the first metal layer, wherein the further metal comprises a greater thickness than the photoresist and partly projects beyond regions of the photoresist, removing the photoresist, wherein a body composed of the further metal arises, the body comprising a projecting upper edge. By virtue of the patterned photoresist, regions covered with the photoresist and regions free of the photoresist arise on the first metal layer. If a further metal is then electrolytically applied on the first metal layer, this takes place only in the regions free of the photoresist. As soon as the thickness of the electrolytically applied further metal exceeds the thickness of the photoresist structures, further metal may also be applied electrolytically above the photoresist structures. The body composed of further metal arising in this case comprises a projecting upper edge that projects beyond the photoresist. In this case, care should be taken to ensure that the amount of further material applied above the photoresist is only so little that the different bodies consisting of further metal that arise do not mutually touch one another to achieve an electrical insulation of the bodies that arise. Afterward, the photoresist may be removed, as a result of which the bodies composed of further material comprise a projecting upper edge. This is advantageous in particular if the optoelectronic semiconductor component is processed further, in particular potted, with an electrically insulating material and the electrically insulating material flows under the projecting upper edge of the body that arises. An optoelectronic semiconductor component comprising additional mechanical stability arises as a result.

The method of producing an optoelectronic semiconductor component may comprise the following steps: first, a carrier is produced, wherein the carrier is produced by applying a chromium layer on a metal layer, wherein the metal layer comprises a thickness of 30 to 200 µm. Afterward, a photoresist is applied on the chromium layer and patterned such that regions composed of the photoresist comprising a predefined cross section are configured on the chromium layer. Afterward, a further metal is electrolytically applied on the chromium layer, wherein the further metal comprises a greater thickness than the photoresist and partly projects beyond the regions composed of the photoresist. Afterward, the photoresist is removed, as a result of which once again regions or bodies of the further metal arise that comprise a projecting upper edge. The bodies composed of the further metal comprising a projecting upper edge may also be regarded as the first metal layer of the temporary carrier, while the second metal layer is one on which the chromium layer was applied at the beginning. After production of the carrier, the method comprises the further steps, namely securing an optoelectronic semiconductor chip on the electrolytically applied metal, applying an electrically insulating material, and detaching the metal layer originally present. This method in which the regions composed of further metal comprising a projecting upper edge are integrated into the first metal layer makes it possible to save material, in particular material of the first metal layer.

The optoelectronic semiconductor chip may connect to an electrolytically applied body by an electrically conductive connection piece.

The electrolytically applied metal may be copper or nickel. Copper or nickel are particularly well suited as electrolytically applied metals that form the regions on which the optoelectronic semiconductor chip is applied.

The electrolytically applied metal may comprise a thickness of 20 to 60 µm. Thicknesses of 20 to 60 µm are particularly advantageous for the structures mentioned.

The first metal layer may be patterned by sawing, laser erosion or etching.

Our optoelectronic semiconductor component comprises a light-emitting semiconductor chip and contact pads, wherein the contact pads comprise residues of a metal of an intermediate layer, in particular chromium. The soldering contacting of the semiconductor component that arises may be improved as a result.

A temporary carrier used to produce the optoelectronic semiconductor component consists of a first metal layer and a second metal layer. The second metal layer is fitted on the first metal layer in a detachable fashion, in particular in a mechanically detachable fashion. Because the second metal layer is fitted on the first metal layer in a mechanically detachable fashion, the second metal layer may be mechanically detached from the first metal layer after completion of the optoelectronic semiconductor component. Detaching by a laser, or etching back the second metal layer becomes superfluous as a result. As a result, the production method for an optoelectronic semiconductor component may be simplified.

The first metal layer of the temporary carrier may consist of copper and comprise a thickness of 0.5 to 20 μm.

The second metal layer of the temporary carrier may consist of copper and comprise a thickness of 30 to 200 μm.

If the thickness of the first metal layer is 0.5 to 20 μm and the thickness of the second metal layer is 30 to 200 μm, these metal layers may easily be detached from one another. In particular, the second metal layer may easily be detached from the first metal layer. Copper is well suited as a material for the two metal layers, or alternatively only for one of the two metal layers.

The temporary carrier may comprise an intermediate layer between the two metal layers, wherein the intermediate layer is a metallic intermediate layer. With an intermediate layer, in particular a metallic intermediate layer, the second metal layer may be detached from the first metal layer more easily.

The intermediate layer may consist of chromium or the intermediate layer may comprise chromium. Chromium is a particularly advantageous material for the intermediate layer since, through the use of chromium, the second metal layer may be detached from the first metal layer very easily. This holds true, in particular, if the first and second metal layers consist of copper.

The above-described properties, features and advantages and the way in which they are achieved will become clearer and more clearly understood in association with the following description of examples explained in greater detail in association with the drawings. Here in each case in a schematic illustration.

Figure 1:
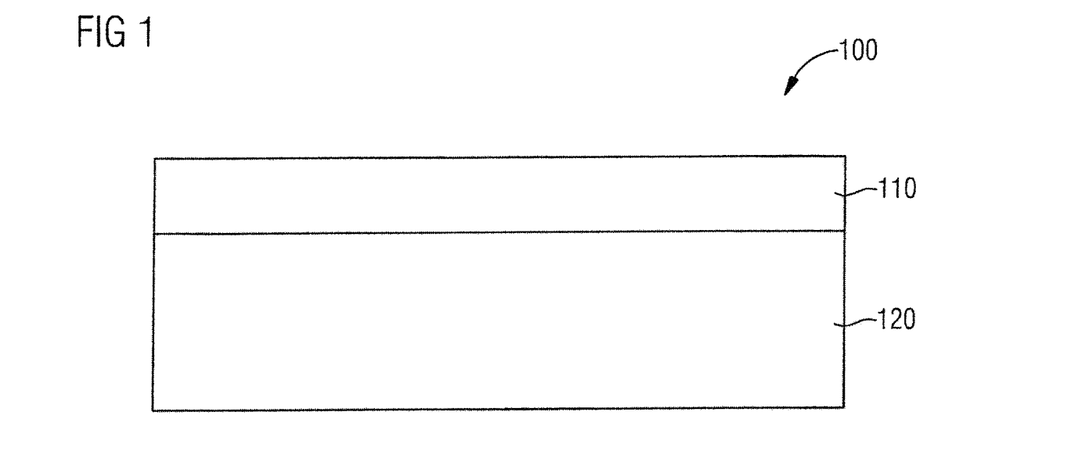
FIG. 1 schematically shows a temporary carrier.

FIG. 1 shows a cross section through a temporary carrier 100. A first metal layer 110 is fitted on a second metal layer 120 such that the second metal layer 120 is mechanically detachable from the first metal layer 110. After further components have been applied on the first metal layer 110, it is possible to detach the second metal layer 120 from the first metal layer 110. In one example, the first metal layer 110 consists of copper. In one example, the second metal layer 120 consists of copper. It is also possible for both metal layers 110, 120 to consist of copper.

The first metal layer 110 comprises a thickness of 0.5 to 20 μm. The second metal layer 120 comprises a thickness of 30 to 200 μm. Other thicknesses of the metal layers are also possible provided that the second metal layer is fitted on the first metal layer in a detachable fashion.

Figure 2:
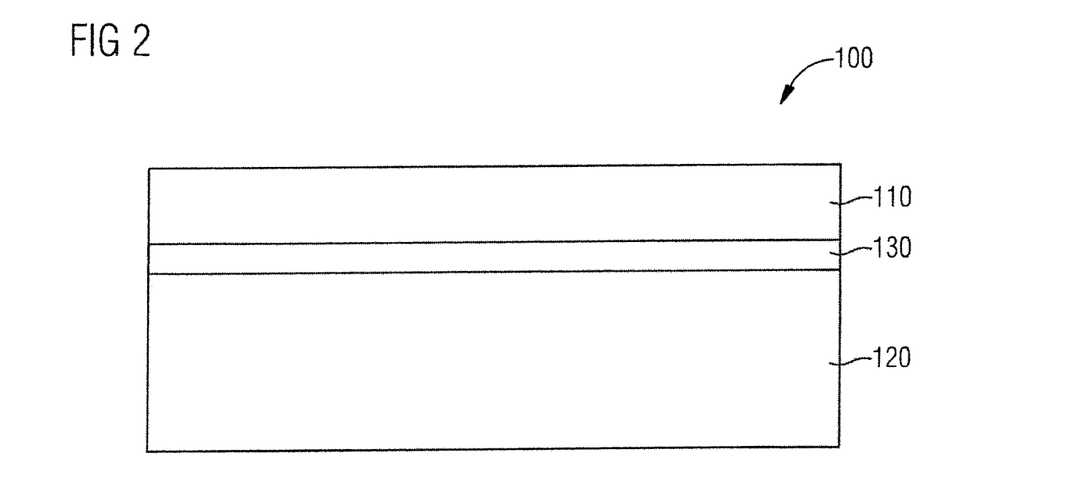
FIG. 2 schematically shows a temporary carrier with intermediate layer.

FIG. 2 shows a further example of a temporary carrier 100. An intermediate layer 130 is situated between the first metal layer 110 and the second metal layer 120. The intermediate layer 130 is a metallic intermediate layer, in particular, and ensures that the second metal layer 120 is detachable from the first metal layer 110 more easily. In one example, the intermediate layer 130 comprises chromium or the intermediate layer 130 consists of chromium.

Figure 3:
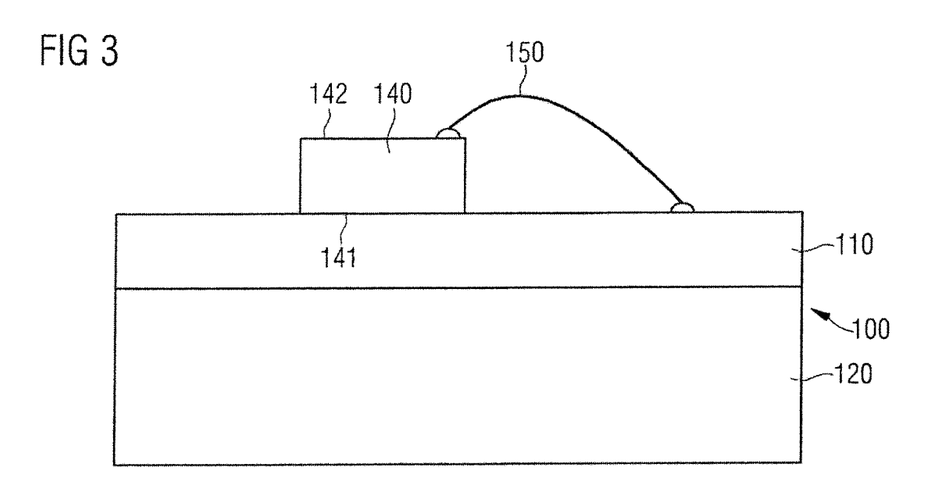
FIG. 3 schematically shows a temporary carrier with applied optoelectronic semiconductor chip and electrical contacting.

FIG. 3 shows a further cross section through a temporary carrier 100, consisting of a first metal layer 110 and a second metal layer 120. An optoelectronic semiconductor chip 140 is fitted on the first metal layer 110. The optoelectronic semiconductor chip 140 comprises an underside 141 and a top side 142. The underside 141 directly adjoins the first metal layer 110. The top side 142 is connected to the first metal layer 110 by an electrically conductive connection piece 150, a bond wire in this example.

Figure 4:
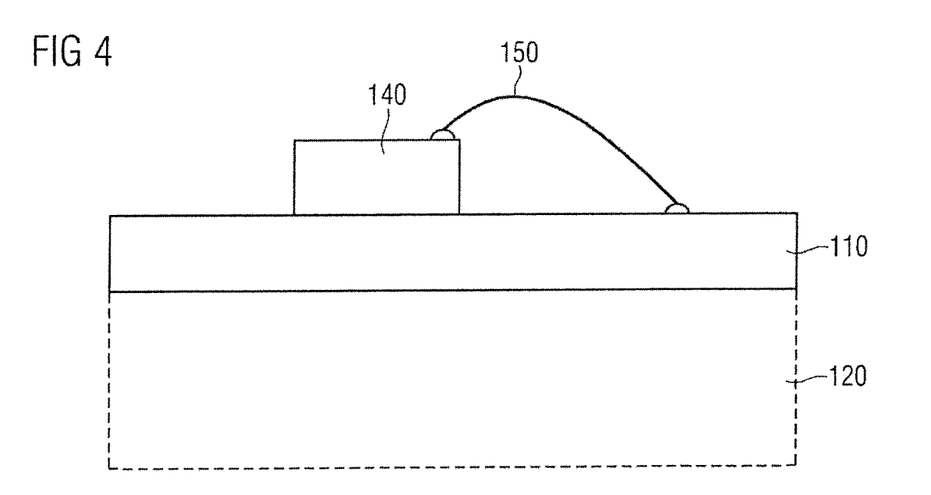
FIG. 4 schematically shows a carrier with optoelectronic semiconductor chip and detached second metal layer.

FIG. 4 shows a cross section through the first metal layer 110 and the optoelectronic semiconductor chip 140 from FIG. 3 after the second metal layer 120 has been mechanically detached from the first metal layer 110. The detached second metal layer 120 is illustrated by dashed lines.

Figure 5:
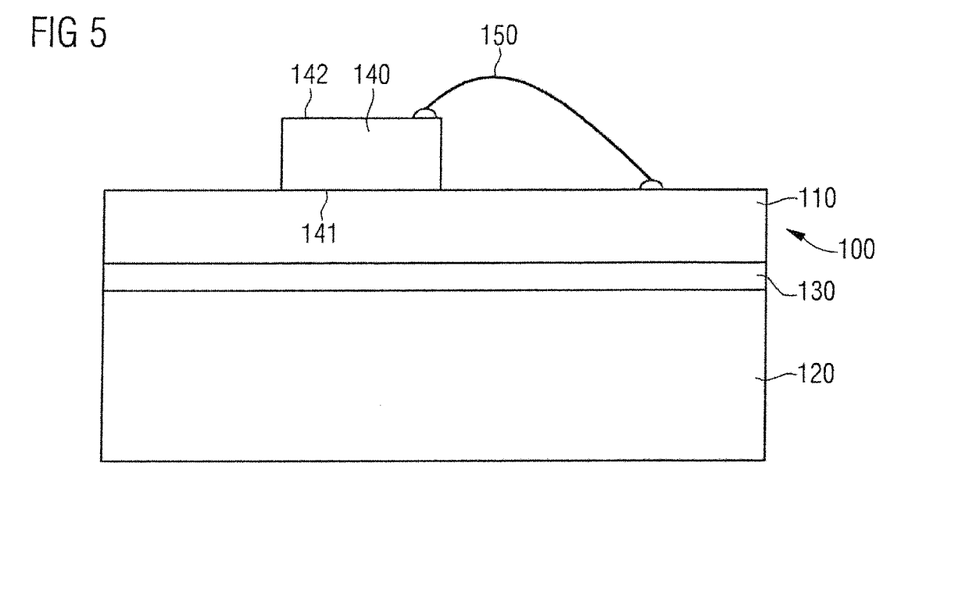
FIG. 5 schematically shows a first method step of producing an optoelectronic semiconductor component.

FIG. 5 shows a cross section through a temporary carrier 100, consisting of a first metal layer 110, a second metal layer 120 and an intermediate layer 130. An optoelectronic semiconductor chip 140 is fitted on the first metal layer 110. The underside 141 of the optoelectronic semiconductor chip 140, the underside forming a first electrical contact location of the optoelectronic semiconductor chip 140, bears on the first metal layer 110. The top side 142 of the optoelectronic semiconductor chip 140, the top side forming a second electrical contact location of the optoelectronic semiconductor chip 140 connects to the first metal layer 110 by an electrically conductive connection piece 150, a bond wire in this case. The carrier 100 with the light-emitting chip 140 and the electrically conductive connection piece 150 constitutes a starting point for producing an optoelectronic semiconductor component. Further production steps are indicated in the following figures.

Figure 6:
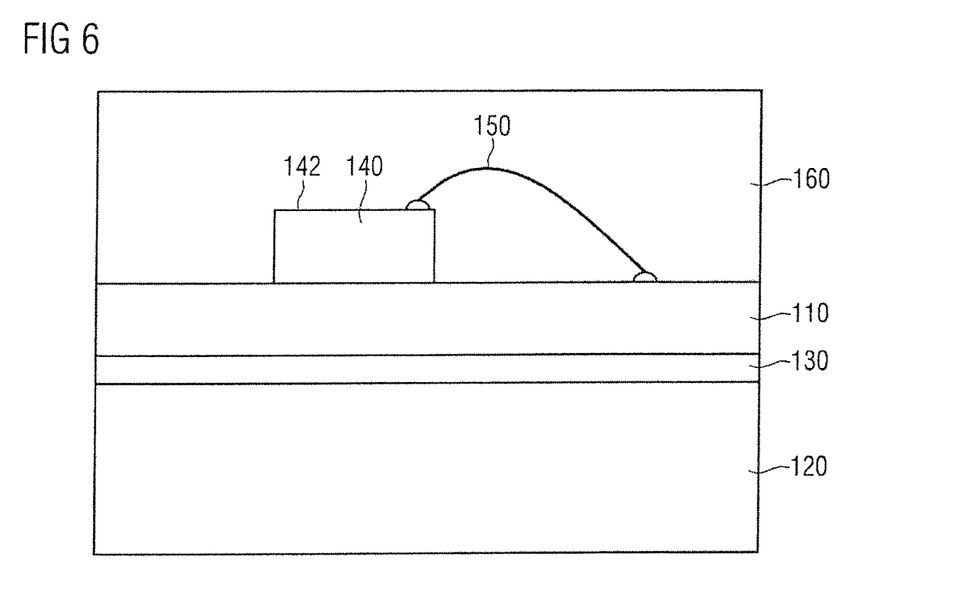
FIG. 6 schematically shows a second method step of producing an optoelectronic semiconductor component.

FIG. 6 shows the temporary carrier 100 with the light-emitting chip 140 and the electrically conductive connection piece 150 from FIG. 4. In addition, an electrically insulating material 160 is fitted on the first metal layer 110. The electrically insulating material 160 may be, for example, a plastic, a resin, a lacquer, or some other insulating material. Since the electrically insulating material 160 covers the top side 142 of the light-emitting chip 140, the electrically insulating material 160 has to be transparent for the radiation of the light-emitting chip 140. In one example, the electrically insulating material 160 comprises a conversion substance or optical elements.

Figure 7:
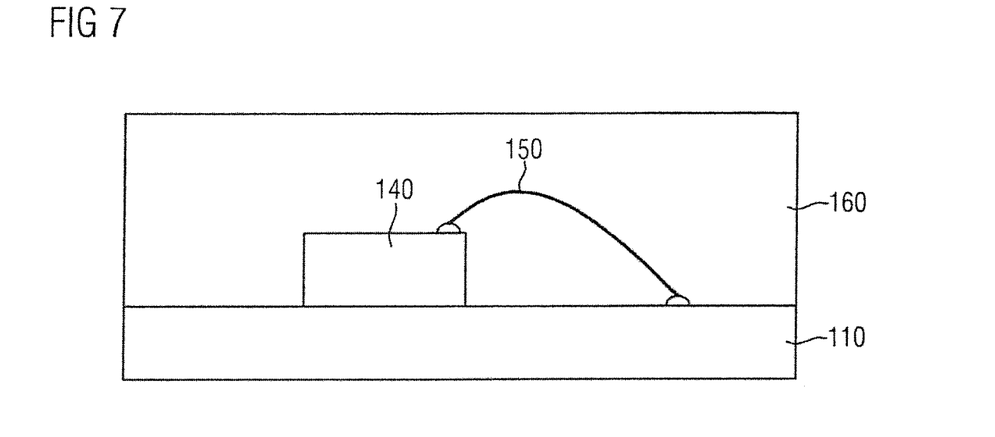
FIG. 7 schematically shows a third method step of producing an optoelectronic semiconductor component.

FIG. 7 shows the next method step in the production of the optoelectronic component following the detachment of the second metal layer 120 (in FIG. 6) from the first metal layer 110. Detaching the second metal layer 120 is mechanical detaching in which the second metal layer 120 is pulled off, torn off or scraped off the first metal layer 110 or mechanically detached from the first metal layer 110 in some other way.

Figure 8:
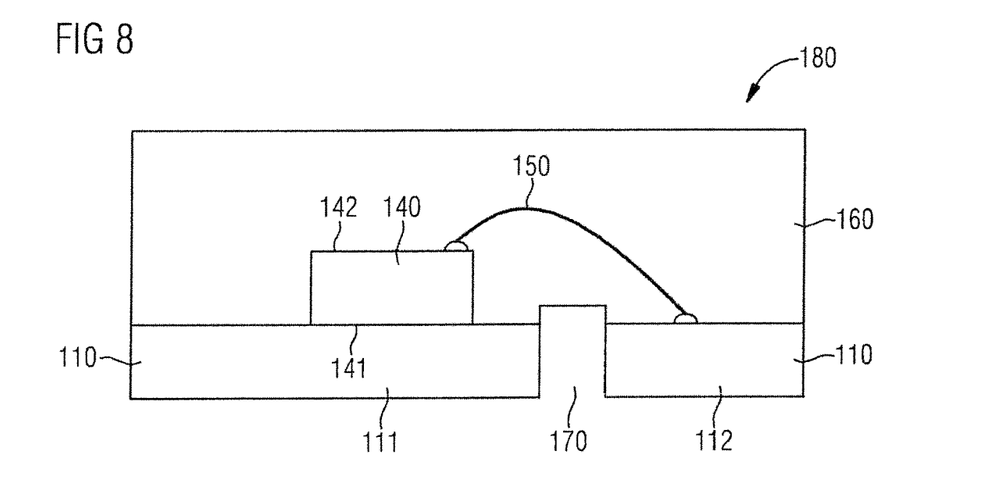
FIG. 8 schematically shows a fourth method step of producing an optoelectronic semiconductor component.

FIG. 8 shows the optoelectronic component after a next method step, in which the first metal layer 110 was patterned in the region 170. The patterning of the first metal layer 110 in the region 170 may be carried out, for example, by sawing, etching, or by laser erosion. As a result of the patterning of the first metal layer 110 in the region 170, the first metal layer 110 is divided into a first region 111 and a second region 112. The underside 141 of the light-emitting chip 140 bears directly on the first region 111 of the first metal layer 110. The top side 142 of the light-emitting chip 140 connects to the second region 112 of the first metal layer 110 by the electrically conductive connection piece 150. As a result, the electrical contacting of the optoelectronic semiconductor component 180 may be carried out via the first region 111 and the second region 112 of the first metal layer 110.

Figure 9:
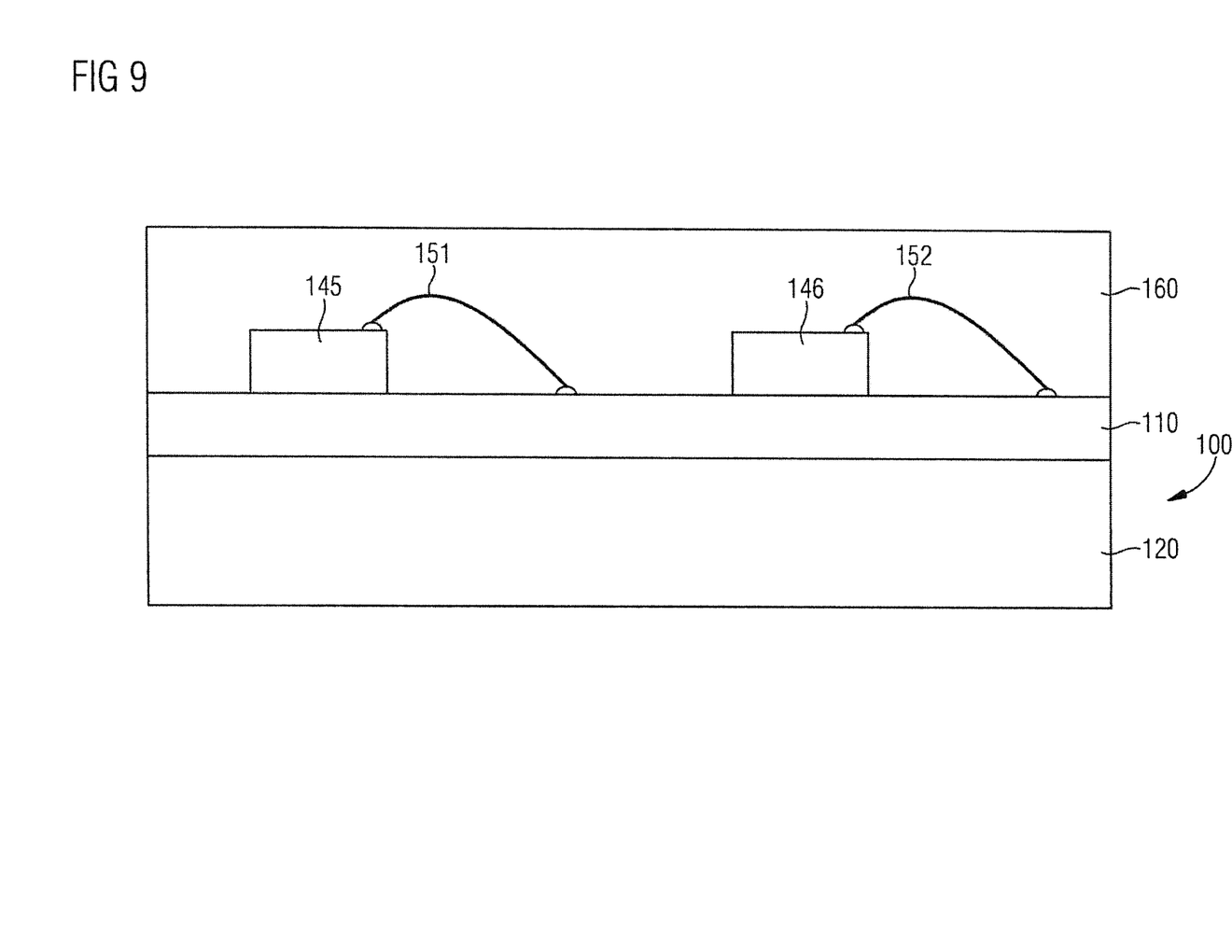
FIGS. 9-11 schematically show the simultaneous production of a plurality of optoelectronic semiconductor components.

FIG. 9 shows a cross section through a carrier 100 comprising a first metal layer 110 and a second metal layer 120. A first optoelectronic semiconductor chip 145 and a second optoelectronic semiconductor chip 146 are fitted on the first metal layer 110, wherein the first optoelectronic semiconductor chip 145 connects to the first metal layer 110 by a first electrically conductive connection piece 151. The second optoelectronic semiconductor chip 146 connects to the first metal layer 110 by a second electrically conductive connection piece 152. An electrically insulating material 160 is applied on the first metal layer 110, the electrically insulating material enclosing both the two optoelectronic semiconductor chips 145, 146 and the two electrically conductive connection pieces 151, 152.

Figure 10:
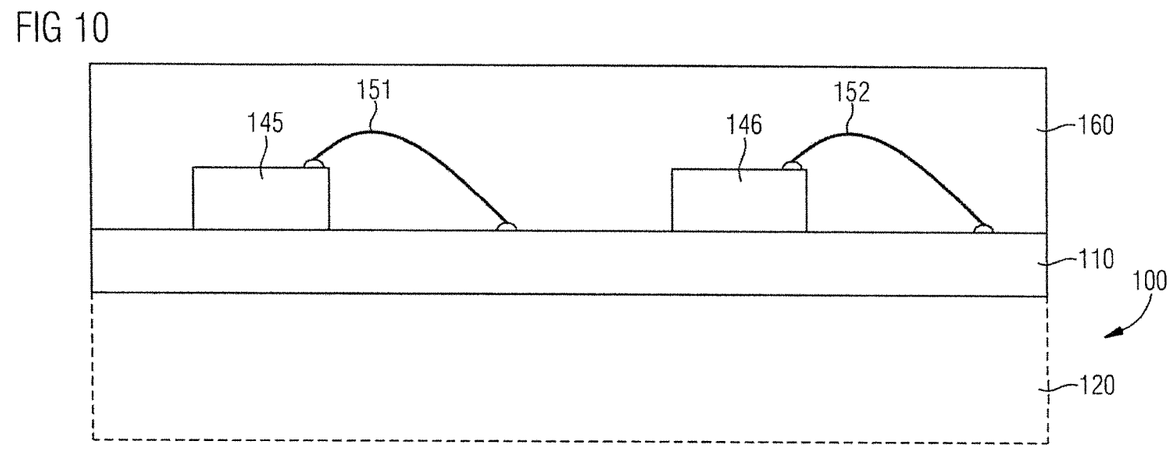

FIG. 10 shows a cross section through the carrier 100 shown in FIG. 9 with the corresponding semiconductor chips 145, 146 and electrically conductive connection pieces 151, 152 after the detachment of the second metal layer 120 from the first metal layer 110. The second metal layer 120 is illustrated by dashed lines.

Figure 11:
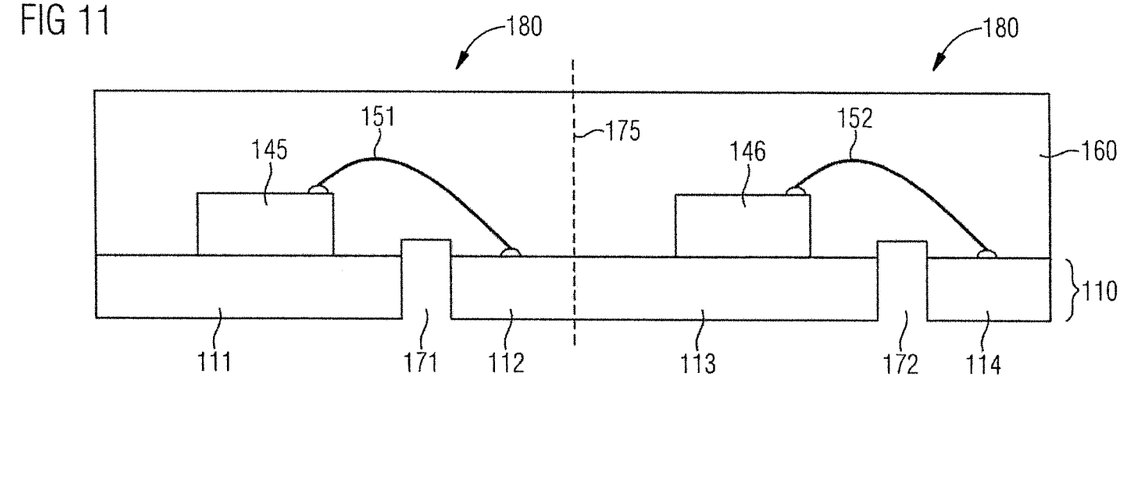

FIG. 11 illustrates the next method step. In a first region 171 of the first metal layer 110, the first metal layer 110 was patterned, just like in a second region 172. As a result of the patterning of the first metal layer 110 in the regions 171 and 172, the first metal layer 110 is divided into four regions 111, 112, 113 and 114. The two optoelectronic semiconductor chips 145, 146 each connect to two regions of the first metal layer 110. The underside of the first optoelectronic semiconductor chip 145 touches the first region 111 of the first metal layer 110. The top side of the first light-emitting semiconductor chip 145 connects to the second region 112 of the first metal layer 110 by a first electrically conductive connection piece 151. The underside of the second optoelectronic semiconductor chip 146 touches the third region 113 of the first metal layer 110. The top side of the second optoelectronic semiconductor chip 146 connects to the fourth region 114 of the first metal layer 110 by a second electrically conductive connection piece 152. A dashed separating line 175 indicates a separation of the two components present on the first metal layer 110. In this case, the separating line 175 also separates the second region 112 from the third region 113 of the first metal layer 110. In the region of the separating line 175, the two components each containing an optoelectronic semiconductor chip 145, 146 may be separated from one another by sawing such that independent optoelectronic semiconductor components 180 are obtained.

More than two optoelectronic semiconductor chips 140 may be fitted on a first metal layer 110.

The first metal layer 110 may comprise copper, in particular, it consists of copper.

The second metal layer 120 may comprise copper, in particular, it consists of copper. The intermediate layer 130 may consist of chromium.

The copper of the first and/or of the second metal layer may be coated with silver, a nickel-silver alloy, a nickel-palladium-gold alloy or with gold to improve the contactability.

Figure 12:
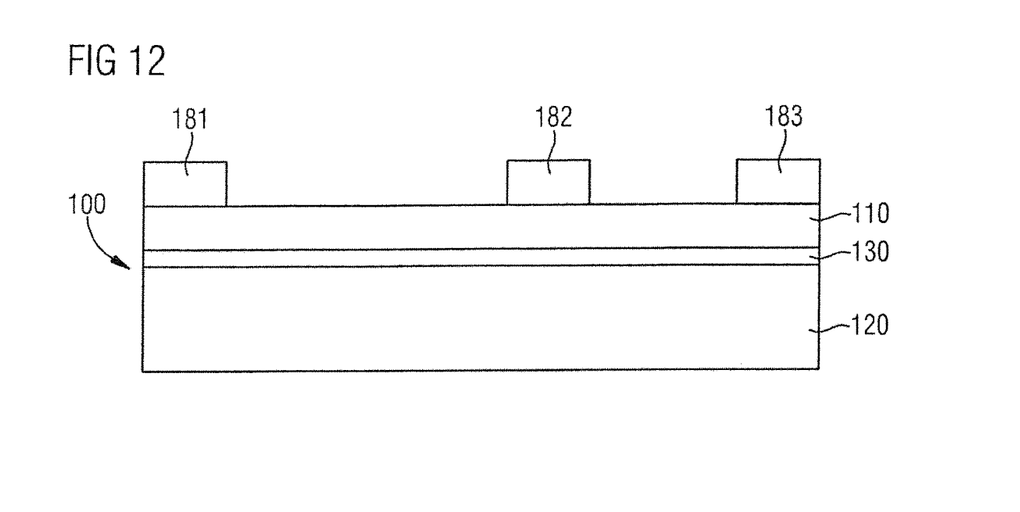
FIGS. 12-15 schematically show a further example of the method of producing an optoelectronic semiconductor component.

FIG. 12 shows a further starting point for a method of producing an optoelectronic semiconductor component. A carrier 100 comprising a first metal layer 110, a second metal layer 120 and an intermediate layer 130 is covered with photoresist in three regions 181, 182 and 183.

Figure 13:
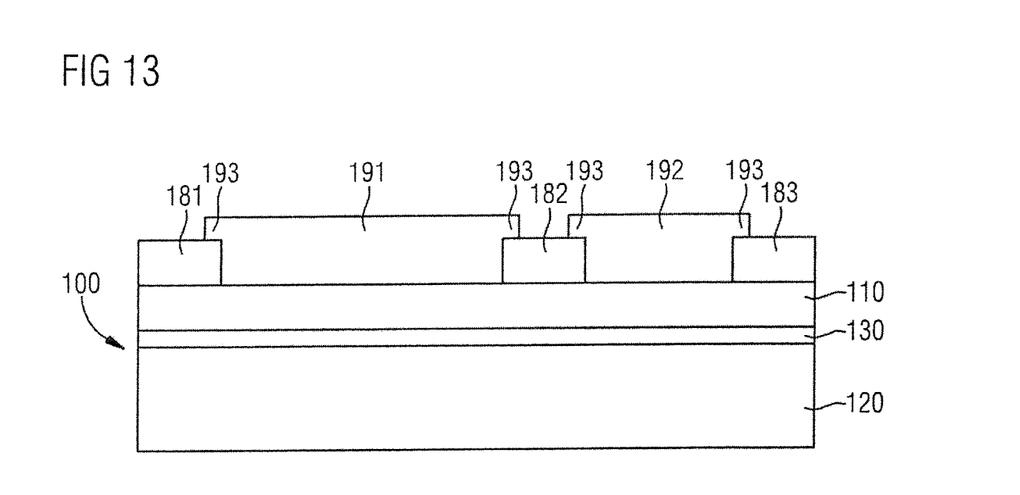

FIG. 13 shows the carrier 100 from FIG. 12 after the next method step in which a further metal was applied electrolytically on the first metal layer 110. Electrolytically applying a further metal on the first metal layer 110 gives rise to a first body 191 and a second body 192 composed of the electrolytically applied further metal. In this case, the thickness of the bodies 191 and 192 is greater than the thickness of the photoresist structures in the three regions 181, 182 and 183. At the instant at which the electrolytically applied further metal comprises the same thickness as the photoresist structures in the regions 181, 182 and 183, the further metal starting from that point forms an upper edge region 193 projecting beyond the photoresist structures. In the upper edge regions 193 of the first body 191 and of the second body 192 of the further electrolytically applied metal, the bodies 191, 192 form a projecting upper edge region 193. The projecting upper edge region 193 projects laterally beyond the photoresist structures 181, 182, 183.

Figure 14:
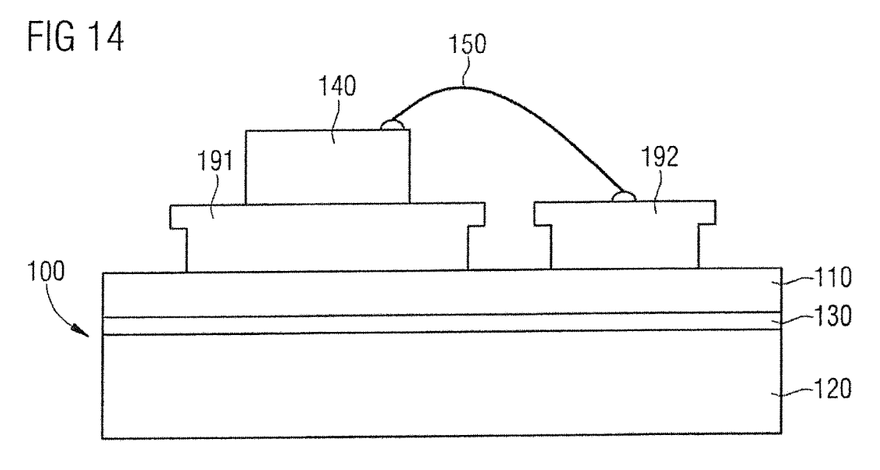

FIG. 14 shows the optoelectronic semiconductor component after a further method step. An optoelectronic semiconductor chip 140 is applied on the first body 191, the optoelectronic semiconductor chip being connected to the second body 192 by an electrically conductive connection piece 150. The photoresist structures are removed such that the bodies 191 and 192 are positioned freely on the first metal layer 110.

Figure 15:
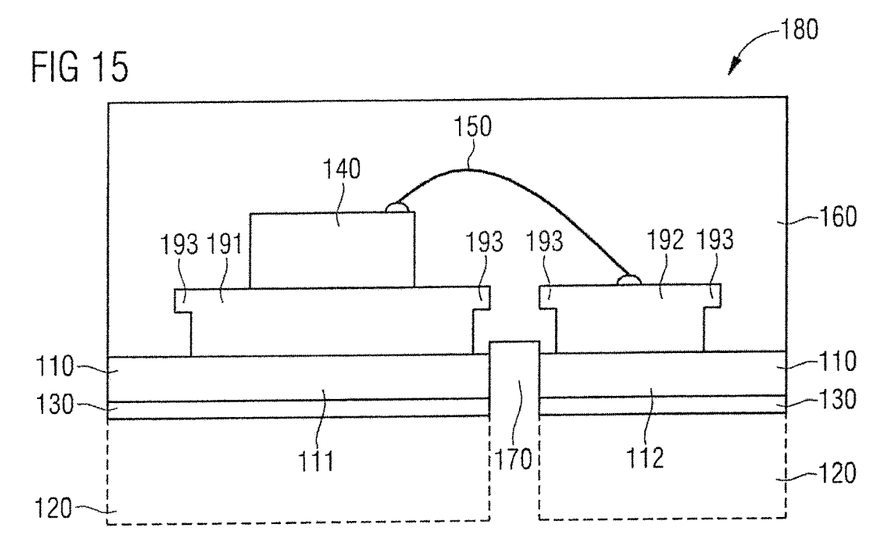

FIG. 15 shows the optoelectronic semiconductor component after further method steps. An electrically insulating material 160 is applied on the first metal layer 110, wherein the electrically insulating material 160 is also applied below the upper edge regions 193 of the first body 191 and of the second body 192. As a result, the first body 191, and also the second body 192, is interlocked with the electrically insulating material 160. The upper edge region 193 of the bodies 191 and 192 results in a particularly good mechanical connection between the bodies 191 and 192 and the electrically insulating material 160. Moreover, to attain the optoelectronic semiconductor component in FIG. 15, the second metal layer 120 was also detached from the first metal layer 110. In addition, the first metal layer 110 was severed in the region 170 such that a first region 111 of the first metal layer 110 adjoins the first body 191 and a second region 112 of the first metal layer 110 adjoins the second body 192. The first region 111 and the second region 112 are separated from one another and electrically insulated from one another. FIG. 15 shows the finished optoelectronic semiconductor component 180.

The first metal layer 110 may be filled with an electrically insulating material in the region 170. In this case, the electrically insulating material may be the same as the electrically insulating material 160. However, it is also possible to use an electrically insulating material that deviates from the electrically insulating material 160.

Figure 16:
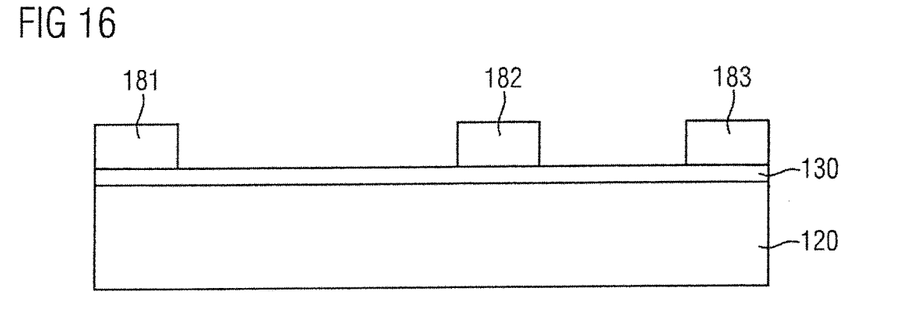
FIGS. 16-19 schematically show a further example of the method of producing an optoelectronic semiconductor component.

FIG. 16 shows the starting point for a further method of producing an optoelectronic semiconductor component. An intermediate layer 130 consisting of chromium, for example, is applied on a second metal layer 120. A photoresist layer is applied on the intermediate layer 130 and subsequently patterned such that a first region 181, a second region 182 and a third region 183 of the photoresist arise.

Figure 17:
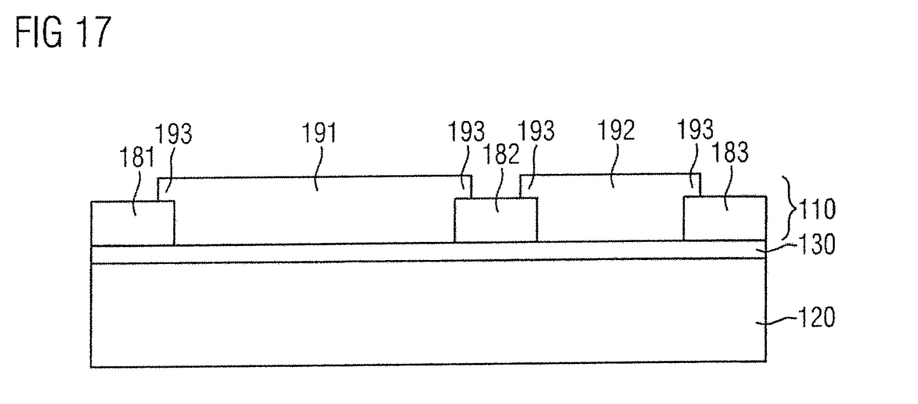

FIG. 17 shows the next method step. An electrolytic material is applied on the intermediate layer 130, thus giving rise to a first body 191 and a second body 192 consisting of the electrolytically applied material. In this case, the electrolytically applied material of the bodies 191 and 192 once again comprises a greater thickness than the regions 181, 182 and 183 of the photoresist. As a result, upper edge regions 193 of the bodies 191 and 192 once again project beyond the regions 181, 182 and 183 of the photoresist.

Figure 18:
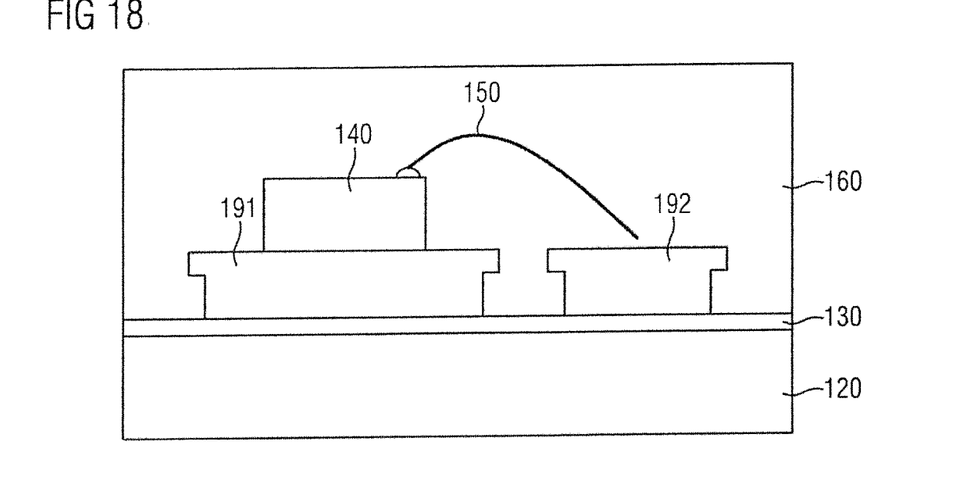

FIG. 18 shows the optoelectronic semiconductor component after further method steps. A semiconductor chip 140 is fitted on the first body 191 composed of the further, electrolytically applied material. The semiconductor chip 140 connects to the second body 192 composed of the electrolytically applied material by an electrically conductive connection piece 150. An electrically insulating material 160, which may in turn contain conversion materials, is applied on the intermediate layer 130. The optoelectronic semiconductor chip 140 is embedded into the electrically insulating material 160. The electrically insulating material 160 may be a plastic, a resin or else some other material to be chosen.

Figure 19:
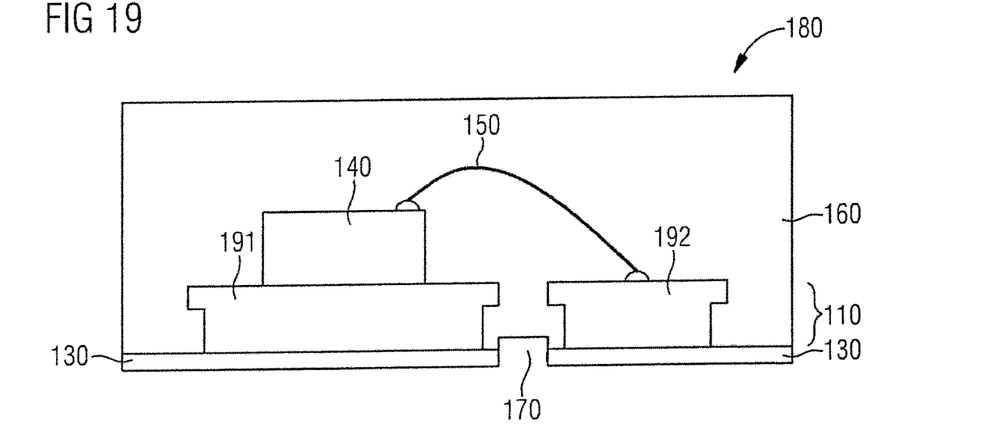

FIG. 19 shows the optoelectronic semiconductor component after further method steps. The metal layer 120 was detached from the intermediate layer 130, or the bodies 191 and 192. Residues of the intermediate layer 130 are still situated on the component. In the region 170 between the first body 191 and the second body 192 of the further, electrolytically applied metal, a separation of the remaining chromium residues was achieved by a sawing cut. Instead of the sawing cut, in the region 170 the chromium residues may also be separated by laser erosion or an etching method. In this case, the two bodies 191 and 192 of the electrolytically applied metal may be interpreted as the first metal layer 110. FIG. 19 thus shows one example of a finished semiconductor component 180 in which the contact pads still comprise residues of the intermediate layer 130, for example, chromium residues.

It is possible for the finished semiconductor component 180 to comprise residues of the intermediate layer 130 on the contact pads arising as a result of the structured first metal layer 110.

The electrolytically applied material may be copper or nickel. The electrolytically applied material may comprise a thickness of 20 to 60 µm. The first metal layer 110 may be patterned by sawing, laser erosion or etching.

Figure 20:
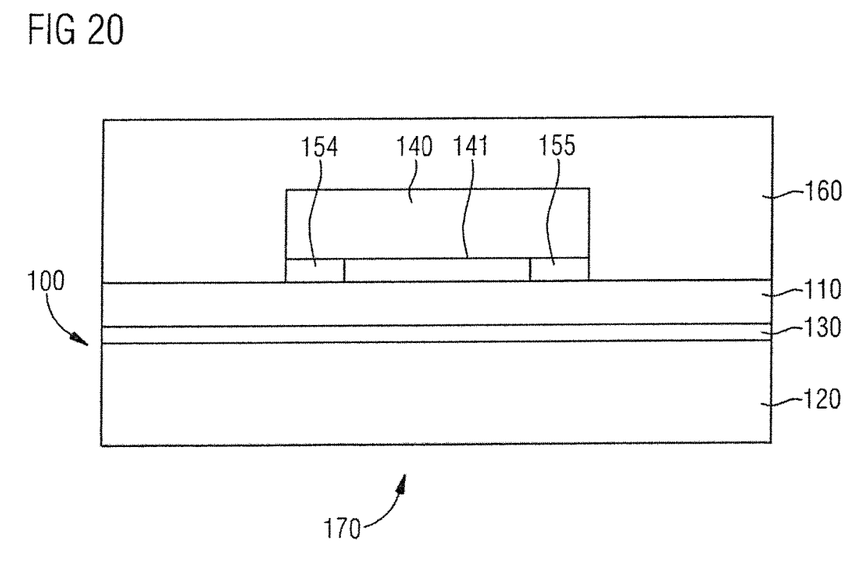
FIG. 20 schematically shows one example of an optoelectronic semiconductor component with flip-chip.

FIG. 20 shows a cross section through a method step of producing an optoelectronic semiconductor component in which the light-emitting semiconductor chip 140 is a so-called flip-chip. The optoelectronic semiconductor chip 140 comprises two electrical contacting pads 154 and 155 on its underside 141, wherein the electrical contacting pads 154, 155 adjoin the first metal layer 110 of a temporary carrier 100. The temporary carrier 100 additionally comprises a second metal layer 120 and an intermediate layer 130. The optoelectronic semiconductor chip 140 is potted by electrically insulating material 160. After the second metal layer 120 has been detached from the first metal layer 110, it is necessary for the first metal layer 110 to be patterned in the region 170 between the two contacting pads 154 and 155.

Figure 21:
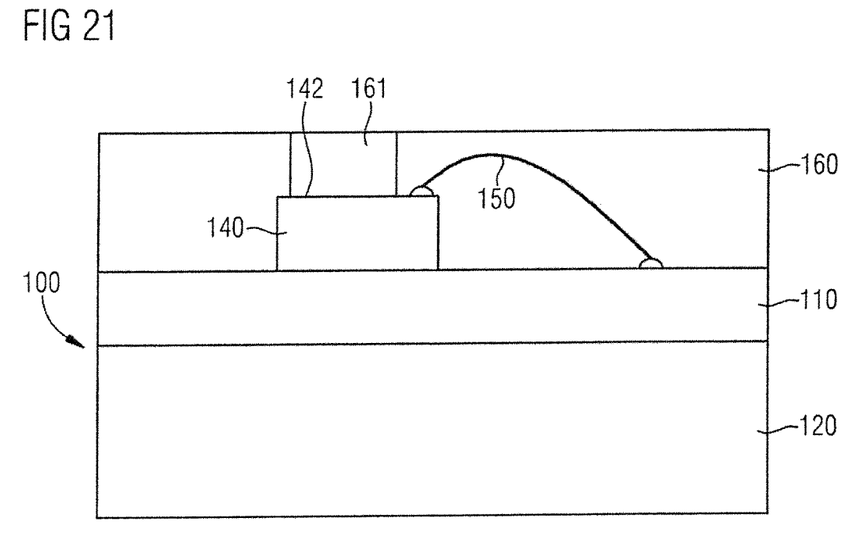
FIG. 21 schematically shows one example of an optoelectronic semiconductor component with conversion element.

FIG. 21 shows an intermediate step in the production of a further example of an optoelectronic semiconductor component. An optoelectronic semiconductor chip 140 is arranged on a temporary carrier 100 consisting of a first metal layer 110 and a second metal layer 120, wherein the optoelectronic semiconductor chip 140 adjoins the first metal layer 110. The top side 142 of the optoelectronic semiconductor chip 140 electrically conductively connects to the first metal layer 110 by an electrically conductive connection piece 150. A conversion lamina 161 is arranged on the top side 142 of the optoelectronic semiconductor chip 140. The semiconductor component is potted by an electrically insulating material 160. The semiconductor component may then be completed by the further steps being performed analogously to FIGS. 7 and 8.

Although our methods, components and carriers have been more specifically illustrated and described in detail by the preferred, nevertheless this disclosure is not restricted by the examples disclosed and other variations may be derived therefrom by those skilled in the art, without departing from the scope of protection of the appended claims.

This application claims priority of DE 10 2015 114 662.2, the subject matter of which is incorporated herein by reference.

The invention claimed is:

1. A method of producing an optoelectronic semiconductor component comprising:
   providing a carrier comprising two metal layers, wherein the metal layers are detachable from one another,
   applying a photoresist on the first metal layer,
   patterning the photoresist such that regions composed of the photoresist comprising a predefined cross section are present on the first metal layer,
   electrolytically applying a further metal on free regions of the first metal layer not covered by the photoresist, wherein the further metal comprises a greater thickness than the photoresist and partly projects laterally beyond regions of the photoresist,
   removing the photoresist, wherein a body composed of the further metal arises, said body comprising a laterally projecting upper edge region,
   securing an optoelectronic semiconductor chip on the further metal, and
   mechanically detaching the second metal layer from the first metal layer.

2. The method according to claim 1, wherein the metal layers comprise copper or consist of copper.

3. The method according to claim 1, wherein the carrier comprises an intermediate layer, optionally a chromium layer, between the two metal layers.

4. The method according to claim 1, wherein the electrolytically applied metal is copper or nickel.

5. The method according to claim 1, wherein the electrolytically applied metal comprises a thickness of 20 to 60 µm.

6. The method according to claim 1, wherein the semiconductor chip is electrically contacted with the first metal layer or the electrolytically applied metal by an electrically conductive connection piece.

7. The method according to claim 1, wherein an electrically insulating material is additionally applied on the first metal layer.

8. The method according to claim 1, wherein the first metal layer is patterned such that mutually electrically insulated regions of the first metal layer arise.

9. A method of producing an optoelectronic semiconductor component comprising:
   providing a carrier comprising two metal layers, wherein the metal layers are detachable from one another,
   securing an optoelectronic semiconductor chip on the first metal layer, and mechanically detaching the second metal layer from the first metal layer, wherein
   a) producing the carrier comprises:
   applying a chromium layer on a metal layer, wherein the metal layer comprises a thickness of 30 to 200 µm,
   applying a photoresist on the chromium layer,
   patterning the photoresist such that regions composed of photoresist comprising a predefined cross section are configured on the chromium layer,
   electrolytically applying a further metal on the chromium layer, wherein the further metal comprises a greater thickness than the photoresist and partly projects beyond the regions composed of photoresist,
   removing the photoresist, wherein a body composed of the further metal arises, said body comprising a projecting upper edge region,
   b) the method further comprises:
   securing an optoelectronic semiconductor chip on the electrolytically applied metal,
   applying an electrically insulating material, and
   mechanically detaching the metal layer.

10. The method according to claim 9, wherein the electrolytically applied metal is copper or nickel.

11. The method according to claim 9, wherein the electrolytically applied metal comprises a thickness of 20 to 60 µm.

* * * * *